United States Patent
Zhou

(10) Patent No.: US 7,790,544 B2
(45) Date of Patent: Sep. 7, 2010

(54) METHOD OF FABRICATING DIFFERENT GATE OXIDES FOR DIFFERENT TRANSISTORS IN AN INTEGRATED CIRCUIT

(75) Inventor: Xianfeng Zhou, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 958 days.

(21) Appl. No.: 11/387,707

(22) Filed: Mar. 24, 2006

(65) Prior Publication Data
US 2007/0224746 A1    Sep. 27, 2007

(51) Int. Cl.
  *H01L 21/8238* (2006.01)
(52) U.S. Cl. .................. 438/216; 438/275; 438/279
(58) Field of Classification Search .................. None
  See application file for complete search history.

(56) References Cited

U.S. PATENT DOCUMENTS

| | | | |
|---|---|---|---|
| 5,908,311 A | 6/1999 | Chi et al. | |
| 6,133,164 A * | 10/2000 | Kim | 438/275 |
| 6,274,430 B1 | 8/2001 | Jan et al. | |
| 6,551,884 B2 * | 4/2003 | Masuoka | 438/275 |
| 6,586,293 B1 * | 7/2003 | Hasegawa | 438/216 |
| 6,711,538 B1 * | 3/2004 | Omori et al. | 704/223 |
| 6,906,954 B2 * | 6/2005 | Shukuri et al. | 365/185.05 |
| 7,030,012 B2 * | 4/2006 | Divakaruni et al. | 438/652 |
| 7,042,764 B2 * | 5/2006 | Shukuri et al. | 365/185.05 |
| 7,045,850 B2 * | 5/2006 | Kim et al. | 257/314 |
| 7,214,590 B2 * | 5/2007 | Lim et al. | 438/287 |
| 7,294,548 B2 * | 11/2007 | Lee et al. | 438/258 |
| 7,348,245 B2 * | 3/2008 | Shinohara et al. | 438/275 |
| 7,351,632 B2 * | 4/2008 | Visokay et al. | 438/216 |
| 7,428,167 B2 * | 9/2008 | Shukuri et al. | 365/185.04 |
| 2002/0173066 A1 * | 11/2002 | Masuoka | 438/60 |
| 2003/0103382 A1 | 6/2003 | Kobayashi | |
| 2004/0023459 A1 * | 2/2004 | Masuoka | 438/275 |
| 2005/0023604 A1 * | 2/2005 | Kim et al. | 257/316 |
| 2005/0258471 A1 | 11/2005 | Lee | |
| 2006/0208303 A1 * | 9/2006 | Kim et al. | 257/314 |

FOREIGN PATENT DOCUMENTS

| | | |
|---|---|---|
| EP | 1 005 079 | 11/1998 |
| JP | 10-261773 | 9/1998 |

\* cited by examiner

*Primary Examiner*—Alonzo Chambliss
(74) *Attorney, Agent, or Firm*—Dickstein Shapiro LLP

(57) ABSTRACT

An integrated circuit and gate oxide forming process are disclosed which provide a gate structure that is simple to integrate with conventional fabrication processes while providing different gate oxide thicknesses for different transistors within the integrated circuit. For a flash memory, which may utilize the invention, the different gate oxide thicknesses may be used for lower voltage transistors, memory array transistors, and higher voltage transistors.

20 Claims, 12 Drawing Sheets

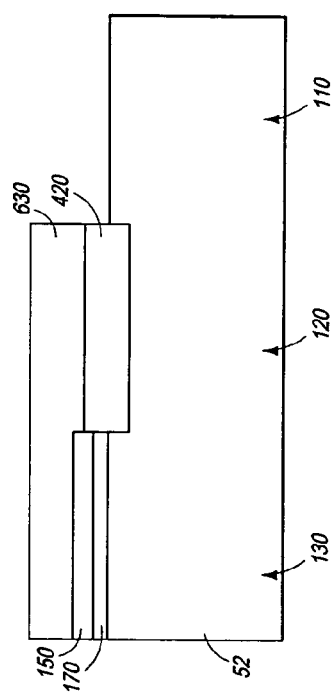
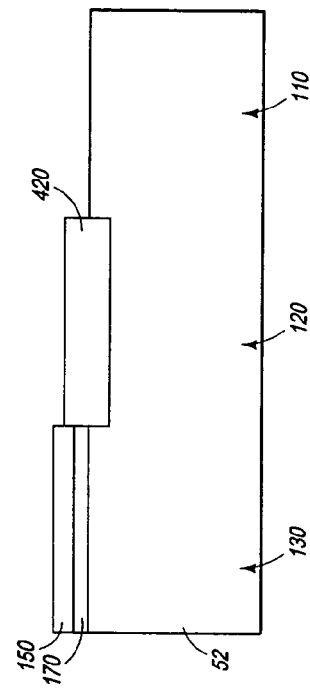
FIG. 7
FIG. 8

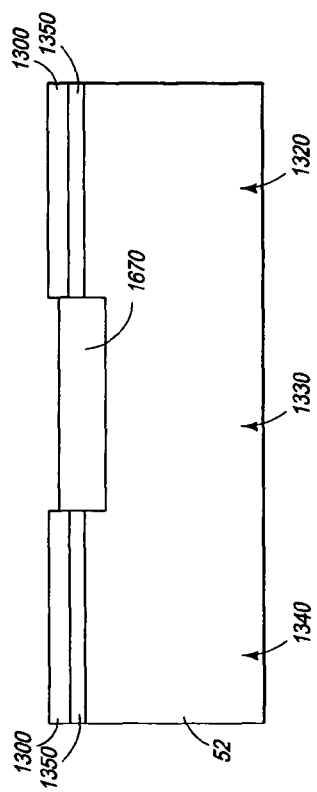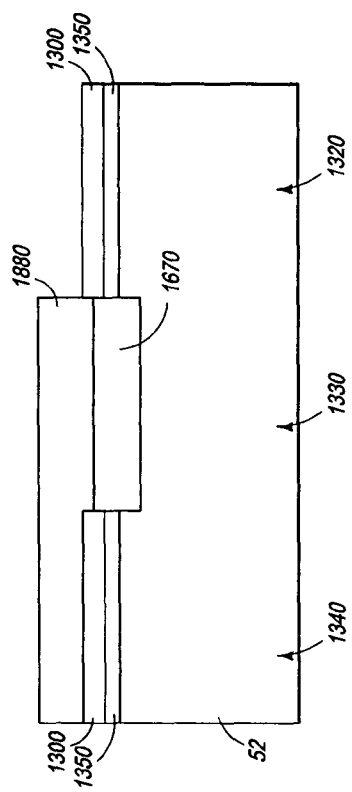
FIG. 19
FIG. 20

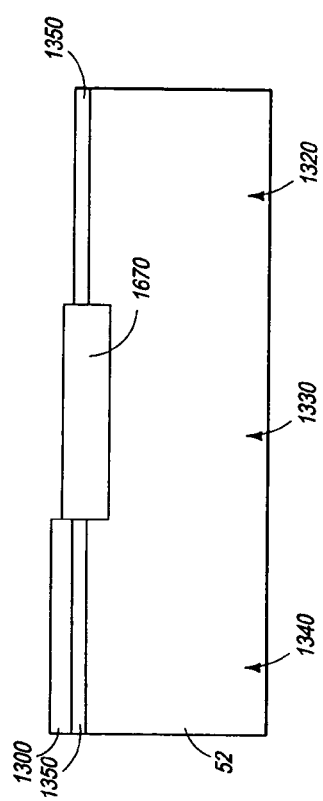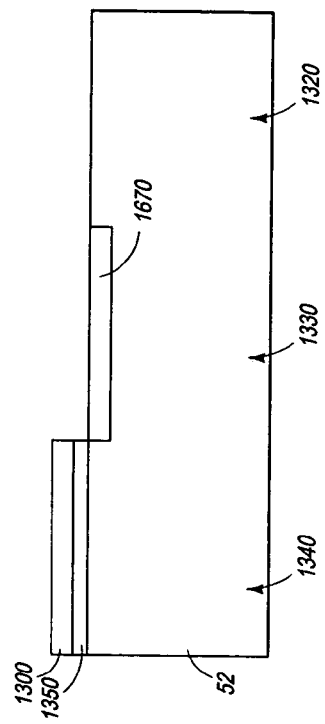

METHOD OF FABRICATING DIFFERENT GATE OXIDES FOR DIFFERENT TRANSISTORS IN AN INTEGRATED CIRCUIT

FIELD OF THE INVENTION

This invention relates generally to the fabrication of semiconductor devices and, more specifically, to a method of forming gate oxide structures.

BACKGROUND OF THE INVENTION

Semiconductor memory devices for storing data can typically be categorized as either volatile memory devices or nonvolatile memory devices. Volatile memory devices lose their stored data when their power supplies are interrupted; nonvolatile memory devices, however, retain their stored data even when their power supplies are interrupted. There are various types of nonvolatile memories including e.g., electrically programmable read only memories (EPROMs), and electrically erasable programmable read only memories (EEPROMs). One type of EEPROM device is a flash EEPROM device (also referred to as "flash memory"). Nonvolatile memory devices e.g., flash memory, have become widely used for storage applications.

A conventional flash memory device includes a plurality of memory cells, each cell having a floating gate covered with an insulating layer. Below the floating gate is another insulating layer sandwiched between the floating gate and the cell substrate. This insulating layer is an oxide layer and is often referred to as the tunnel oxide. The substrate contains doped source and drain regions, with a channel region disposed between the source and drain regions.

In one conventional process for forming flash memory, memory cells and low voltage logic transistors (e.g., MOSFETs) share the same gate oxide as memory cell transistors in order to simplify the process and reduce fabrication cost. The thickness of this gate oxide typically is between 70-90 Å to maintain proper data retention for the memory cell transistors. However, this gate oxide thickness limits the performance of the logic transistors which ideally should have a thinner gate oxide for high performance. A flash memory also typically has high voltage transistors which require a thicker gate oxide than that used for the memory cells and logic transistors. A thinner gate oxide for the logic transistors would require a triple oxide thickness process that includes a 30-50 Å thick gate oxide for logic transistors, a 70-90 Å thick gate oxide as tunnel oxide for memory cells, and a 350-400 Å thick gate oxide for high voltage transistors. Fabricating gate oxides having there different thicknesses not only increases the complexity of the process flow, but also introduces tunnel oxide quality concerns because, based on the existing conventional multiple oxide processes, one has to grow a tunnel oxide in several oxidation steps with many patterning and resist strip steps in between.

BRIEF SUMMARY OF THE INVENTION

The invention relates to a gate oxide structures and a process for forming the gate structures in an integrated circuit having different oxide thicknesses corresponding to different types of transistors in the integrated circuit. In one exemplary embodiment, the invention provides different gate oxide thicknesses for the transistors in low voltage area, the high voltage area and the memory array area of a memory device to better tailor transistor performance. The inventive method and resulting structure are particularly suitable for fabricating flash memory devices.

BRIEF DESCRIPTION OF THE DRAWINGS

The foregoing and other advantages and features of the invention will become more apparent from the detailed description of exemplary embodiments provided below with reference to the accompanying drawings in which:

FIG. 7 shows a cross sectional view of the substrate at a fabrication stage subsequent to FIG. 6;

FIG. 8 shows a cross sectional view of the substrate at a fabrication stage subsequent to FIG. 7;

FIG. 19 shows a cross sectional view of the substrate at a fabrication stage subsequent to FIG. 18;

FIG. 20 shows a cross sectional view of the substrate at a fabrication stage subsequent to FIG. 19;

FIG. 21 shows a cross sectional view of the substrate at a fabrication stage subsequent to FIG. 20;

FIG. 22 shows a cross sectional view of the substrate at a fabrication stage subsequent to FIG. 21;

DETAILED DESCRIPTION OF THE INVENTION

Figure 1:
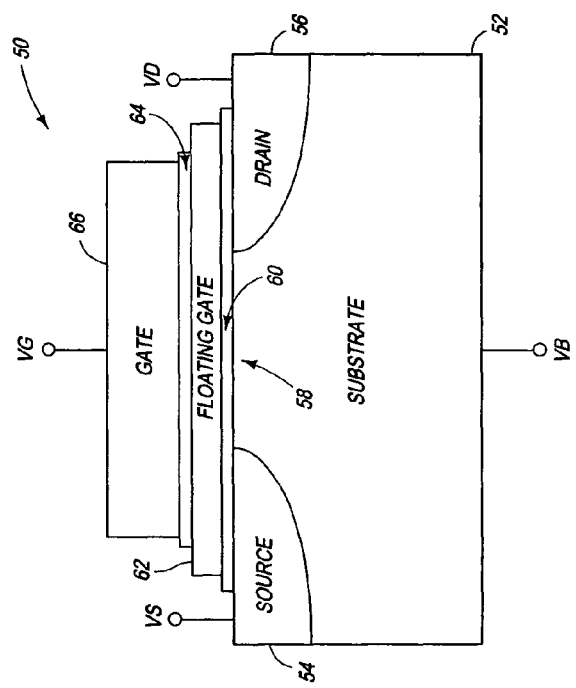
FIG. 1 is a diagram illustrating an exemplary flash memory cell.

In the following detailed description, reference is made to the accompanying drawings which form a part hereof, and in which is shown by way of illustration specific embodiments by which the invention may be practiced. It should be understood that like reference numerals represent like elements throughout the drawings. These exemplary embodiments are described in sufficient detail to enable those skilled in the art to practice the invention. It is to be understood that other embodiments may be utilized, and that structural, logical and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "substrate" is to be understood as including all forms of semiconductor wafers and substrates including, silicon, silicon-on-insulator (SOI), silicon-on-sapphire (SOS), doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in or above the base semiconductor structure or foundation. In addition, the semiconductor need not be silicon-based, but could be based on other semiconductors, for example, silicon-germanium, germanium, or gallium arsenide.

The invention is described below with respect to forming gate oxide structures for different types of transistors employed in a flash memory, however, the invention is not limited to flash memory and may be used to fabricated any integrated circuit where different gate oxide thicknesses may be desired for different types of transistors.

FIG. 1 illustrates an exemplary flash memory cell 50 having a gate structure. The cell 50 has a stack-gate configuration and comprises a substrate 52 that may be doped with a p-type dopant to form a p-type substrate 52. Alternatively, the substrate 52 may be doped with an n-type dopant to form a n-type substrate 52, if so desired. The cell 50 includes source and drain regions 54, 56 formed within the substrate 52. If the substrate 52 has been doped with a p-type dopant, then the source and drain regions 54, 56 are created by implanting the substrate 52 with an n-type dopant to form N+ regions 54, 56. If, on the other hand, the substrate 52 has been doped with a n-type dopant, then the source and drain regions 54, 56 are created by implanting the substrate 52 with an p-type dopant to form P+ regions 54, 56.

The source region 54 is spaced apart from the drain region 56 to form a channel region 58 between the source and drain regions 54, 56. A tunnel oxide layer 60 is located on the surface of the substrate 52. The tunnel oxide layer 60 comprises a dielectric material such as e.g., silicon dioxide, over the surface of the substrate 52.

A floating gate 62 is formed over the tunnel oxide 60. The floating gate 62 is a conductive material and may be e.g., polysilicon. An insulating layer 64 is positioned on top of the floating gate 62. The insulating layer 64 comprises a dielectric material such as e.g., silicon dioxide. The control gate 66 is formed over the insulating layer 64. The control gate 66 is a conductive layer and may be a polysilicon layer. In flash memory integrated circuits, memory cells having the general transistor construction illustrated in FIG. 1 are employed along with low voltage logic transistors and high voltage power transistors, both of which have source/drain regions in the substrate, and a gate structure between the source/drain regions which includes a gate oxide, and a control gate over the gate oxide.

Figure 2:
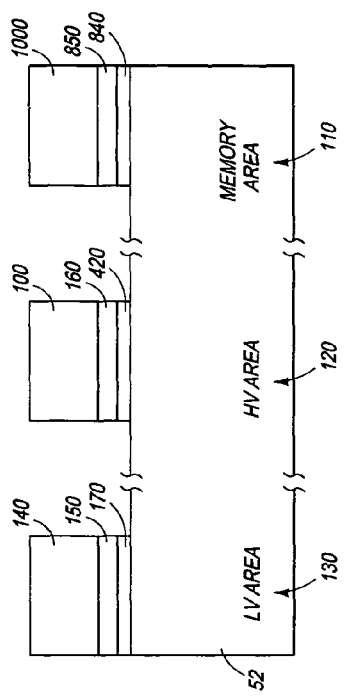
FIG. 2 shows a cross sectional view of gate structures for different transistors of a non-volatile memory device constructed in accordance with an exemplary embodiment of the invention.

Methods of forming different gate oxide thicknesses for the memory array transistors, low voltage transistors and high voltage transistors is now described with reference to FIGS. 2-21. FIG. 2 is a simplified cross sectional view of gate structures for different transistors in different regions of a flash memory device constructed in accordance with the exemplary embodiment of the invention described below. FIG. 2 shows gate structures for memory cell transistors, low voltage logic transistors (LV area), and high voltage power transistors (HV area). FIG. 2 illustrates the gate structure subsequent to the fabrication stages shown in FIGS. 3-12 but prior to the remaining fabrication stages used to complete the formation of the transistors. As shown in FIG. 2, low voltage logic transistors have a gate structure comprising a gate oxide layer 170, a polysilicon control gate layer 150, and an overlying nitride layer 140. The high voltage transistors have a gate structure comprising a gate oxide layer 420, a polysilicon control gate layer 160 and a nitride layer 100, and the memory array transistors comprising a gate oxide layer 840, floating gate layer 850 and nitride layer 1000. The gate oxide 170 is the thinnest gate oxide and may have a thickness in the range of about 30 Å to about 50 Å, the gate oxide 420 is the thickest gate oxide and may have a thickness in the range of about 350 Å to about 400 Å, and the memory array gate oxide 840 has a thickness between that of gate oxide 170 and gate oxide 420 and may have a thickness in the range of about 70 Å to about 90 Å. FIGS. 3-12 illustrate the fabrication stages for forming the FIG. 2 transistor gate structures in accordance with one embodiment of the invention.

Figure 3:
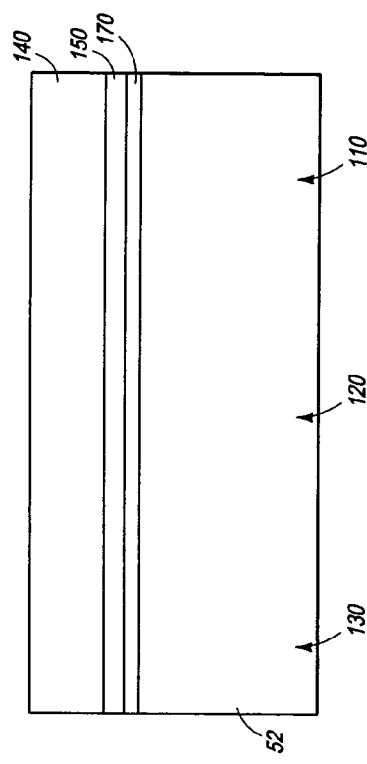
FIG. 3 shows a cross sectional view of a substrate during an early fabrication stage in accordance with the exemplary embodiment of the invention.
Figure 4:
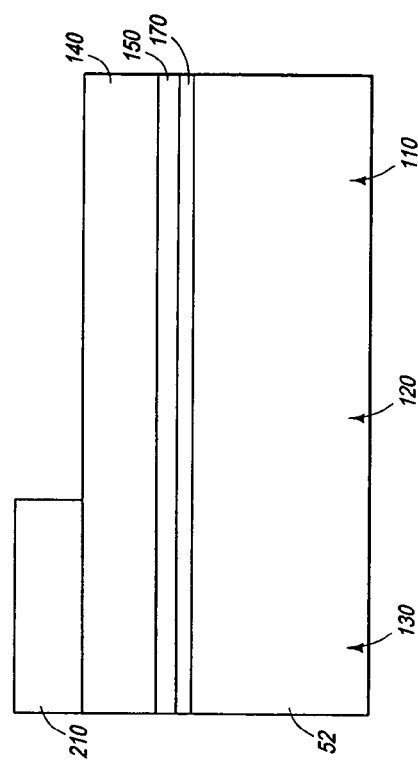
FIG. 4 shows a cross sectional view of the substrate at a fabrication stage subsequent to FIG. 3.
Figure 5:
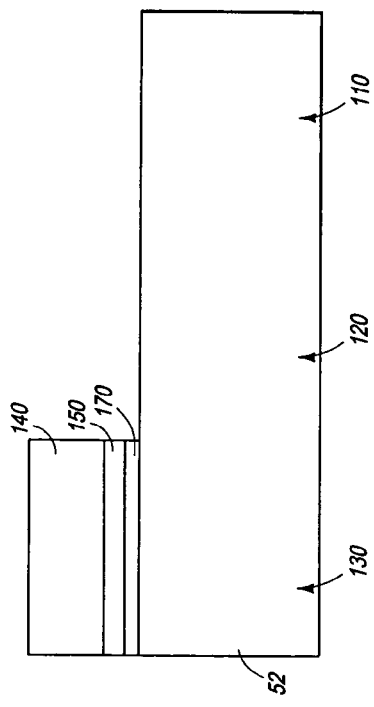
FIG. 5 shows a cross sectional view of the substrate at a fabrication stage subsequent to FIG. 4.

Referring now to FIG. 3, a substrate 52 comprising a memory array area 110, a high voltage (HV) area 120 and a low voltage (LV) area 130 is illustrated. Typically, a sacrificial oxide layer (not shown), usually a thin layer of silicon dioxide, is an initial oxide layer deposited on the surface of the substrate 52 and then removed from the surface of the substrate 52. Subsequent to the removal of the sacrificial oxide layer, a layer of gate oxide 170 is deposited or grown and then a layer of polysilicon 150 is deposited over the gate oxide layer 170. A nitride hard mask layer 140 is deposited over the layer of polysilicon 150. Referring to FIG. 4, a layer of photoresist 210 is selectively deposited above nitride hard mask layer 140 in a region over the low voltage area 130, leaving the layers above the high voltage and memory array areas 120, 110 exposed and uncovered. Referring to FIG. 5, a reactive ion etch (RIE) is used to remove the nitride hard mask layer 140 and the polysilicon layer 150 and gate oxide layer 170 from over the high voltage and memory array areas 120, 110. Afterward, the photoresist 210 (FIG. 4) is removed.

Figure 6:
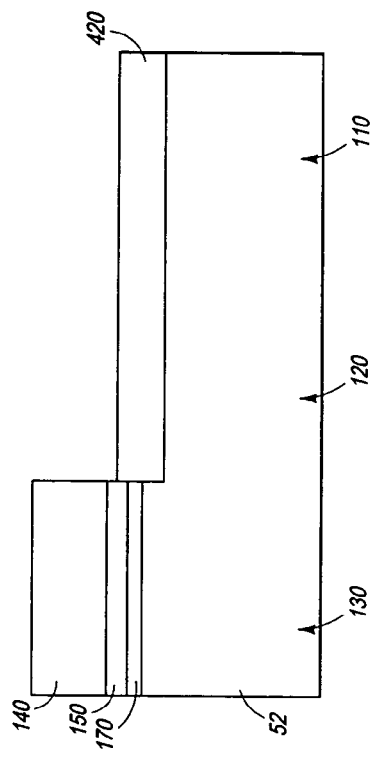
FIG. 6 shows a cross sectional view of the substrate at a fabrication stage subsequent to FIG. 5.

Referring to FIG. 6, a gate oxide layer 420 is thermally grown over the HV and memory array areas 120, 110, while the remaining nitride hard mask 140 protects the remaining polysilicon layer 150 and gate oxide layer 170 above the LV area 130. The nitride hard mask layer 140 is next removed from over the low voltage area 130 using a wet or dry etch (FIG. 7). Still referring to FIG. 7, photoresist 630 is selectively applied above polysilicon layer 150 and gate oxide layer 420 in the high voltage and low voltage areas 120, 130 exposing the gate oxide 420 over the memory array. Then, a wet or dry etch is conducted to remove the gate oxide layer 420 from above the memory array area 110. As shown in FIG. 8, the gate oxide layer 420 from above the memory array area 110 is removed, as is the photoresist 630 (FIG. 7).

Figure 9:
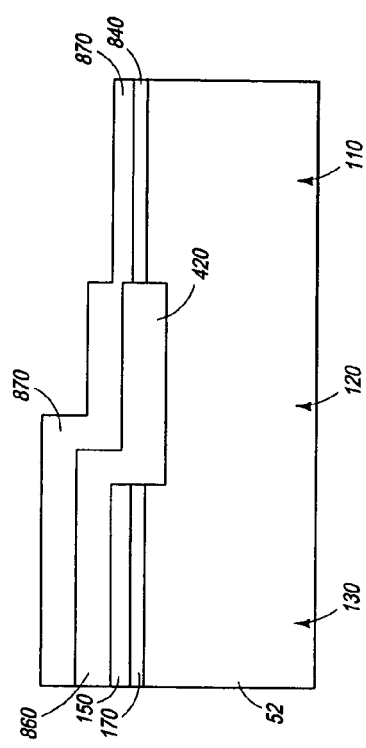
FIG. 9 shows a cross sectional view of the substrate at a fabrication stage subsequent to FIG. 8.
Figure 10:
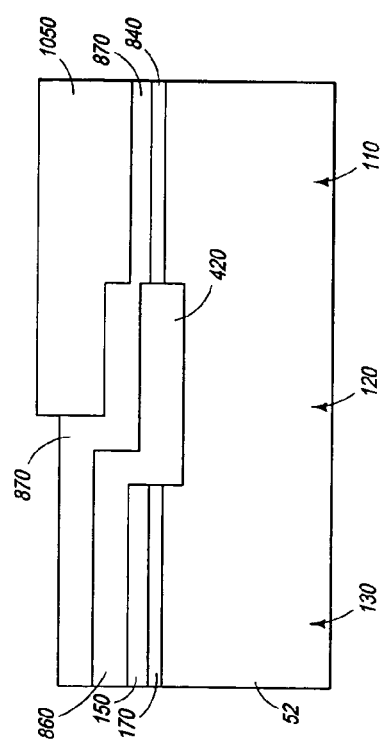
FIG. 10 shows a cross sectional view of the substrate at a fabrication stage subsequent to FIG. 9.
Figure 11:
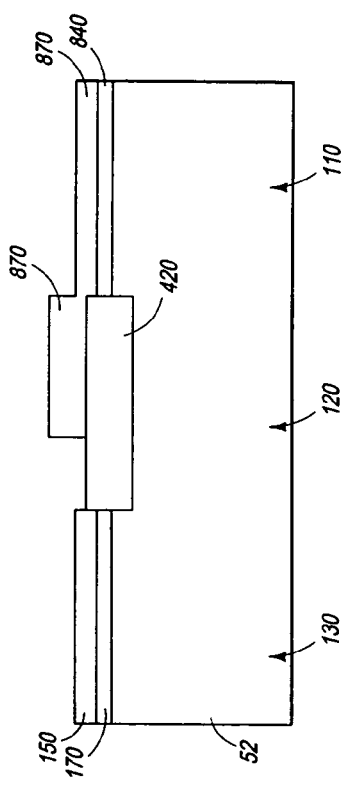
FIG. 11 shows a cross sectional view of the substrate at a fabrication stage subsequent to FIG. 10.
Figure 12:
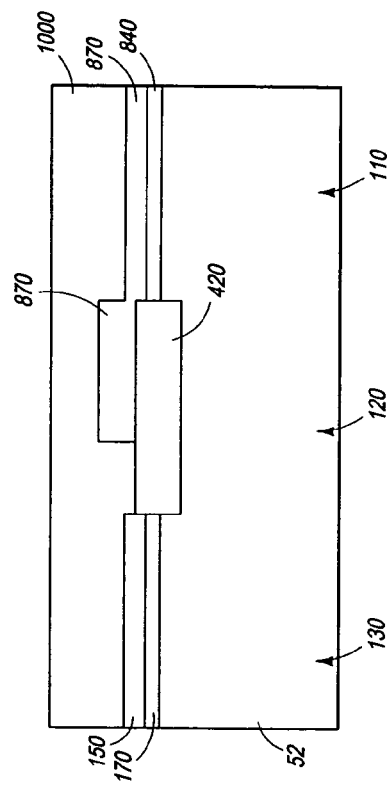
FIG. 12 shows a cross sectional view of the substrate at a fabrication stage subsequent to FIG. 11.

A thin gate oxide layer 840 is next grown above the memory array area 110 as shown in FIG. 9. As a result of growing the thin gate oxide layer 840, exposed gate oxide layer 420 will continue to thicken. Meanwhile, the gate oxide layers above the low voltage area 130 continue to be protected by the polysilicon layer 150. In addition, oxide layer 860 is grown on the polysilicon layer 150 in the low voltage area 130. Subsequently, a layer of polysilicon 870 is deposited above all of the gate oxide layers 170, 840, 860 to form a floating gate for the memory array transistors. Referring to FIG. 10, a photoresist 1050 is formed above the surfaces of polysilicon layer 870 in the high voltage and memory array areas 120, 110. As a result, the layers 150, 170, 860, 870 above the low voltage area 130 are left exposed. Referring to FIG. 11, the polysilicon layer 870 and the oxide layer 860 are removed from above the low voltage area 130 using dry or wet etch methods. The photoresist layer 1050 is also removed. Next, a nitride layer 1000 is deposited as a CMP stop layer above the surfaces of polysilicon layer 150, gate oxide layer 420, and polysilicon layer 870, as shown in FIG. 12.

Figure 13:
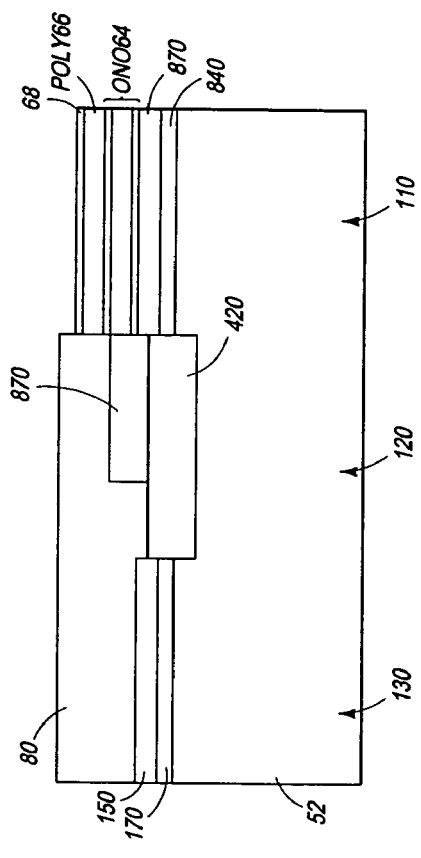
FIG. 13 shows a cross sectional view of the substrate at a fabrication stage subsequent to FIG. 12.
Figure 14:
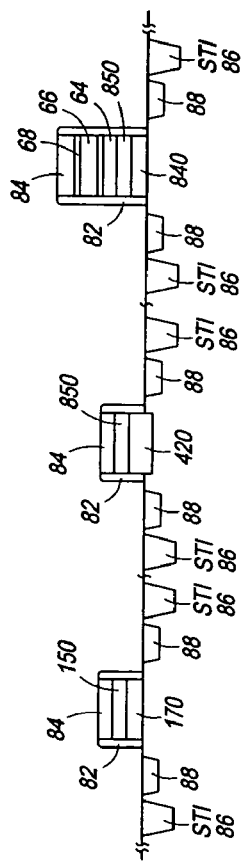
FIG. 14 shows a cross sectional view of the substrate at a fabrication stage subsequent to FIG. 13.

The remaining fabrication steps for fabrication of the transistors in the low voltage area, high voltage area and memory array area follow conventional techniques which are briefly described in connection with FIGS. 13 and 14. As shown in FIG. 13, the nitride layer 1000 is removed by any etching method known in the art. Then, a mask 80 is used to protect the low voltage and high voltage areas. An inter-poly dielectric layer 64, typically an oxide-nitride-oxide (ONO) sandwich layer, is deposited in the memory array area 110 above the floating gate polysilicon layer 870. Referring back to FIG. 1, a control gate polysilicon layer 66 is selectively deposited above the inter-poly dielectric layer 64, above which a metal silicide 68 is selectively formed. After mask 80 is removed, the blanket deposited transistor gate layers in the low voltage, high voltage and memory array areas are patterned to form individual transistor gates. Trench STI isolation regions 86 are formed to isolate transistors and source/drain regions 88 and insulating sidewalls 82 and gate oxide or nitride caps 84 are formed for the transistors, as shown in FIG. 14. The entire structure is then covered by another oxide layer 72, typically BPSG, and planarized by CMP. The BPSG layer 72 is contact patterned and etched and then filled with either a heavily doped polysilicon or tungsten to form conductors to the transistors.

The invention provides different gate oxide thicknesses for the transistors in low voltage area 130, the high voltage area 120 and the memory array area 110 to better tailor transistor performance. In the illustrated embodiment, the transistors in the low voltage area have the thinnest gate oxide 170, e.g., about 30 Å to about 50 Å, with the gate oxide 840 in the memory array transistors being thicker, e.g., about 70 Å to about 90 Å, and the gate oxide 420 of the high voltage transistors being the thickest, e.g., about 350 Å to about 400 Å.

A modified embodiment of the invention is next described with reference to FIGS. 15-23.

Figure 15:
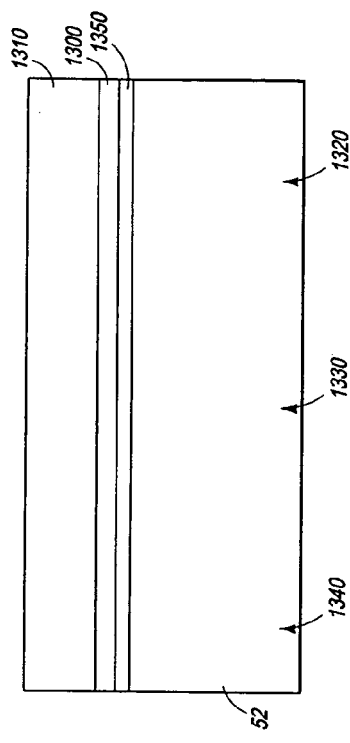
FIG. 15 shows a cross sectional view of a substrate at an early fabrication stage in accordance with another exemplary embodiment of the invention.

Referring to FIG. 15, a substrate 52 comprising a memory array area 1320, a high voltage area 1330 and a low voltage area 1340 is illustrated. An initial deposited or grown sacrificial oxide layer (not shown) is removed and a thin gate oxide layer 1350 is deposited or grown. Subsequently, a polysilicon layer 1300 and a nitride hard mask layer 1310 are deposited above the thin gate oxide layer 1350.

Figure 16:
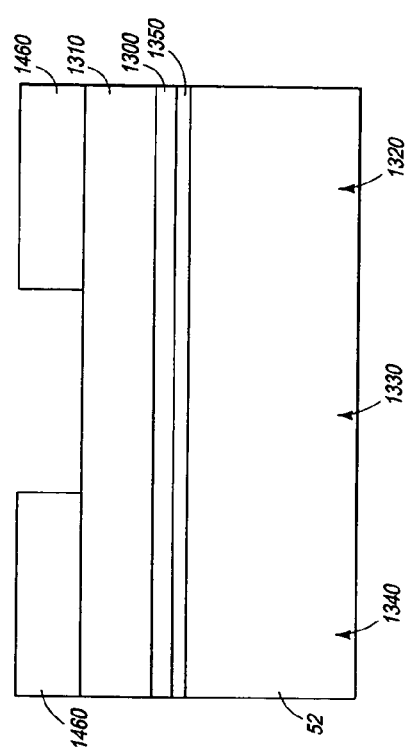
FIG. 16 shows a cross sectional view of the substrate at a fabrication stage subsequent to FIG. 15.
Figure 17:
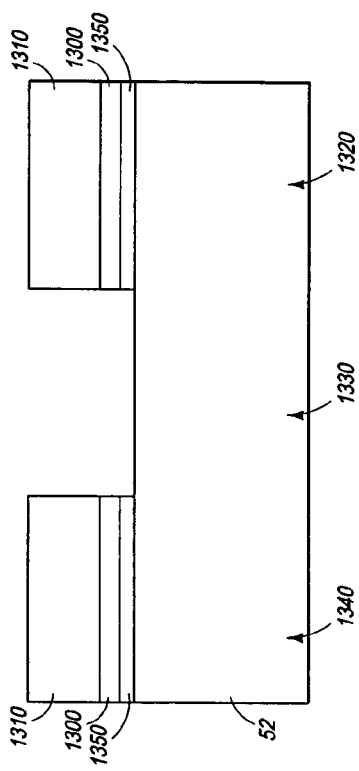
FIG. 17 shows a cross sectional view of the substrate at a fabrication stage subsequent to FIG. 16.
Figure 18:
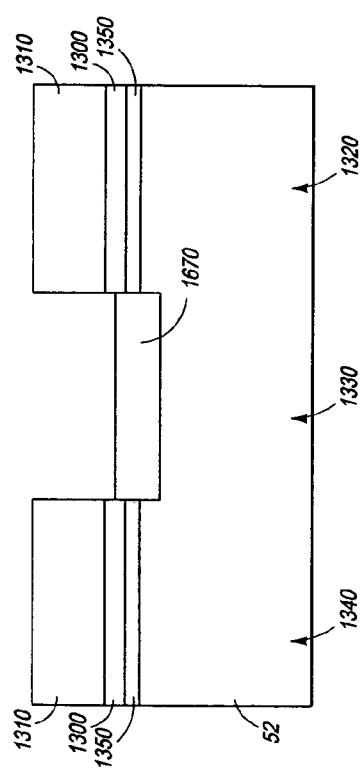
FIG. 18 shows a cross sectional view of the substrate at a fabrication stage subsequent to FIG. 17.
Figure 23:
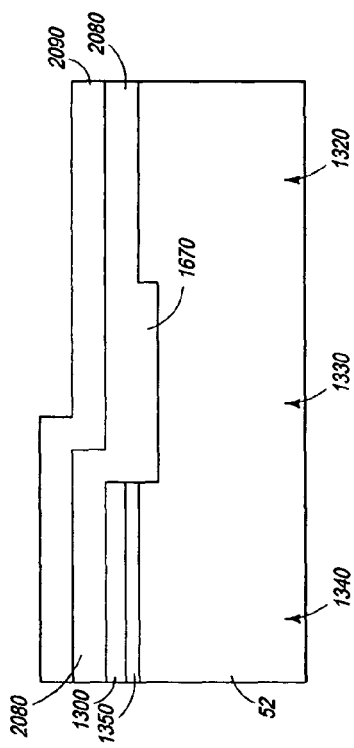
FIG. 23 shows a cross sectional view of the substrate at a fabrication stage subsequent to FIG. 22.

Referring to FIG. 16, photoresist material 1460 is applied above the nitride hard mask layer 1310 that is deposited above both the low voltage and memory array areas 1340, 1320. Using a wet or dry etch, the nitride hard mask layer 1310, polysilicon layer 1300 and gate oxide layer 1350 are removed from above the high voltage area 1300, as shown in FIG. 17, after which, the photoresist 1460 is removed. A gate oxide layer 1670 is thermally grown in the high voltage area 1330, while the nitride hard mask layer 1310 protects the low voltage and memory array areas 1340, 1320, as shown in FIG. 18.

Referring to FIG. 19, nitride hard mask layer 1310 (i.e., from above the polysilicon layer 1300 of the low voltage and memory array areas) is removed using a wet or dry etch. However, as mentioned above, it should be appreciated that the invention is not limited to removing the nitride hard mask layer 1310 using a dry or wet etch, but that any type of etching method known in the art can be used to remove the nitride.

Referring to FIG. 20, a photoresist 1880 is applied above polysilicon layer 1300 above the low voltage area 1340 and gate oxide layer 1670 to protect the layers. The mask is used to etch polysilicon layer 1300 in the memory array area 1320. Once the etch is complete, the photoresist 1880 is removed. Referring to FIGS. 21 and 22, gate oxide layer 1350 is selectively wet or dry etched from above the memory array area 1320, while recessing the gate oxide layer 1670 formed above the high voltage area 1330 to planarize the surface. Then, referring to FIG. 23, a gate oxide layer 2080 is grown above the memory array area. As a result of growing of gate oxide layer 2080, gate oxide layer 1670 will thicken and rise and the gate oxide layer 2080 will also grow over polysilicon layer 1300.

A layer of polysilicon 2090 is then deposited above gate oxide layers 1670, 2080. The resulting structure is very similar to that illustrated in FIG. 9. Accordingly, the remaining fabrication stages of the gate structures follow the process flow described with reference to FIGS. 10-14.

The initial advantage of the described embodiments is that the process is based on a conventional flash process and thus, the overall integration of the process is simple and compatible with existing fabrication processes. The thinner gate oxide layer which can be achieved for the low voltage logic areas of the substrate permits fabrication of higher performance logic transistors. The memory array tunnel oxide layer is kept intact and hence no degradation of the memory array performance will occur.

Figure 24:
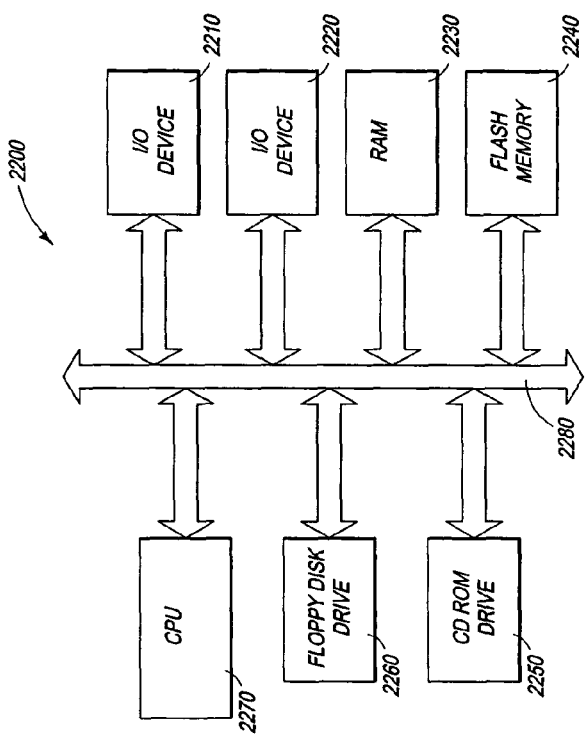
FIG. 24 shows a processor system incorporating at least one gate structure constructed in accordance with the exemplary embodiment of the invention.

FIG. 24 is a block diagram of a processor-based system 2200 utilizing a flash memory device 2240 constructed in accordance with the invention. That is, the flash memory device 2240 is formed by the methods described and illustrated above. The processor-based system 2200 may be a computer system, a process control system or any other system employing a processor and associated memory. The system 2200 includes a central processing unit (CPU) 2270, e.g., a microprocessor, that communicates with the flash memory 2240 and an I/O device 2210 over a bus 2280. It must be noted that the bus 2280 may be a series of buses and bridges commonly used in a processor-based system, but for convenience purposes only, the bus 2280 has been illustrated as a single bus. A second I/O device 2220 is illustrated, but is not necessary to practice the invention. The processor-based system 2200 also includes random access memory (RAM) device 2230 and may include a read-only memory (ROM) device (not shown), and peripheral devices such as a floppy disk 2260 and a compact disk (CD) ROM drive 2250 that also communicates with the CPU 2270 over the bus 2280 as is well known in the art.

It should be noted that the methods of the invention are applicable to formation of any type of integrated circuit where three different transistor gate oxide thicknesses are described, including integrated circuit memory devices including, for example, flash memory.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the

What is claimed as new and desired to be protected by Letters Patent of the United States is:

1. A method of forming a gate oxide structure in an integrated circuit, comprising the steps of:
   forming a first gate oxide layer above first and second voltage areas and a memory area of a substrate;
   removing a portion of said first gate oxide layer from at least said second voltage and said memory area;
   forming a second gate oxide layer above at least said second voltage area and said memory area, said second gate oxide layer having a thickness greater than said first gate oxide layer;
   removing said second gate oxide layer from at least above said memory area;
   forming a third gate oxide layer above said memory area, said third gate oxide layer having a thickness between that of said first and said second gate oxide layers; and
   forming a first polysilicon layer above said first and second voltage areas and said memory area to form a floating gate for memory array transistors.

2. The method of claim 1, wherein said first gate oxide layer is also removed from said memory array area when removed from said second array voltage area, wherein said second gate oxide layer is also formed above said memory any area when formed over said second voltage area, and wherein said second gate oxide layer is removed from said memory area before said third gate oxide layer is formed.

3. The method of claim 2, further comprising:
   removing said first polysilicon layer and said first gate oxide layer from above said second voltage area and said memory area;
   forming three oxide layers to form an additional oxide layer above said first polysilicon layer;
   forming a second polysilicon layer above said additional oxide layer and said second and third gate oxide layers, and
   removing said second polysilicon layer and said additional oxide layer from over said first voltage area.

4. The method of claim 3, further comprising:
   forming an insulating layer over said first polysilicon layer in said first voltage area and said second polysilicon layer in said second voltage area and memory area.

5. The method of claim 4, wherein said insulating layer is a nitride layer.

6. The method of claim 4, further comprising:
   removing said insulating layer from over said third memory array area; and
   forming a gate structure for a floating gate transistor above said third memory any area.

7. The method of claim 1, wherein said first gate oxide layer is removed from said second voltage area and left above said first voltage area and said memory area, wherein said second gate oxide layer is formed above said second voltage area and not above said first voltage area and said memory area, and wherein said first gate oxide layer is removed from above said memory array area.

8. The method of claim 7, further comprising:
   forming a first polysilicon layer over said first gate oxide layer;
   removing said first polysilicon layer and said first gate oxide layer from above said second voltage area, leaving said first polysilicon layer and said first gate oxide layer intact above said first voltage area and said memory area;
   forming said second gate oxide layer above said second voltage area;
   removing said first polysilicon layer and said first gate oxide layer from above said memory area;
   forming a three gate oxide structure in said memory area and forming an additional oxide layer over said first polysilicon layer in said first voltage area;
   forming a second polysilicon layer over said first gate oxide layer, said second gate oxide layer, and said additional oxide layer above said first and second voltage areas and said memory area; and
   removing said second polysilicon layer and said additional oxide layer from over said first voltage area.

9. The method of claim 8, further comprising:
   forming an insulating layer over said first polysilicon layer in said first voltage area and said second polysilicon layer in said second voltage area and memory area.

10. The method of claim 9, wherein said insulating layer is a nitride layer.

11. The method of claim 9, further comprising:
    removing said insulating layer from over said third memory array area; and
    forming a gate structure for a floating gate transistor above said memory area.

12. The method of claim 1, wherein said first, second and third gate oxide layers are employed in a memory device.

13. The method of claim 12, wherein said memory device is a flash memory device.

14. The method of claim 1, wherein said first gate oxide layer is formed to a thickness of about 30 Å to about 50 Å.

15. The method of claim 1, wherein said second gate oxide layer is formed to a thickness of about 350 Å to about 400 Å.

16. The method of claim 1, wherein said third gate oxide layer is formed to about 70 Å to about 90 Å.

17. The method of claim 1, wherein said first gate oxide layer is formed to a thickness of about 30 Å to about 50 Å, said second gate oxide layer is formed to a thickness of about 350 Å to about 400 Å, and said third gate oxide layer is formed to about 70 Å to about 90 Å.

18. The method of claim 1, wherein said first voltage area is a low voltage area.

19. The method of claim 1, wherein said second voltage area is a high voltage area.

20. The method of claim 1, wherein said memory area is a memory array area.

* * * * *

UNITED STATES PATENT AND TRADEMARK OFFICE
CERTIFICATE OF CORRECTION

PATENT NO. : 7,790,544 B2  Page 1 of 1
APPLICATION NO. : 11/387707
DATED : September 7, 2010
INVENTOR(S) : Xianfeng Zhou It is certified that error appears in the above-identified patent and that said Letters Patent is hereby corrected as shown below:

In column 7, line 12, in Claim 1, after "voltage" insert -- area --.

In column 7, line 26, in Claim 2, after "memory" delete "array".

In column 7, line 27, in Claim 2, after "second" delete "array".

In column 7, line 29, in Claim 2, before "area" delete "any".

In column 7, line 50, in Claim 6, after "said" delete "third".

In column 7, line 51, in Claim 6, after "memory" delete "array".

In column 7, line 53, in Claim 6, after "said" delete "third".

In column 7, line 53, in Claim 6, after "memory" delete "any".

In column 8, line 3, in Claim 7, after "memory" delete "array".

In column 8, line 32, in Claim 11, after "said" delete "third".

In column 8, line 33, in Claim 11, after "memory" delete "array".

Signed and Sealed this

Seventh Day of December, 2010

David J. Kappos
*Director of the United States Patent and Trademark Office*